(12) United States Patent
Nguyen et al.

(10) Patent No.: US 6,664,816 B1
(45) Date of Patent: Dec. 16, 2003

(54) SIGNAL AMPLITUDE COMPARATOR

(75) Inventors: Tri Nguyen, Fort Collins, CO (US); Kenneth G. Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/207,943

(22) Filed: Jul. 30, 2002

Related U.S. Application Data

(63) Continuation-in-part of application No. 10/156,963, filed on May 29, 2002, now Pat. No. 6,617,889.

(51) Int. Cl.⁷ .......................... H03K 5/153; H03K 5/22
(52) U.S. Cl. .................. 327/74; 327/74; 327/78
(58) Field of Search .......................... 327/77, 78, 79, 327/80, 81, 83, 85, 88, 89, 359, 361, 362, 74

(56) References Cited

U.S. PATENT DOCUMENTS

| | | | |
|---|---|---|---|
| 4,931,797 A | * 6/1990 | Kagawa et al. | 341/162 |
| 6,064,240 A | * 5/2000 | Wachter | 29/407.08 |
| 6,229,350 B1 | * 5/2001 | Ricon-Mora | 327/77 |
| 6,448,821 B1 | * 9/2002 | Sakurai | 327/56 |

* cited by examiner

*Primary Examiner*—Tuan T. Lam
(74) *Attorney, Agent, or Firm*—Trexler, Bushnell, Giangiorgi & Blackstone

(57) ABSTRACT

A signal amplitude comparator which includes a first input that receives an input signal and generates an output signal that is a non-linear function of the input signal, and a second input circuit that receives a reference input signal and generates a second output signal that generally tracks process, temperature and supply variation. The signal amplitude comparator also includes an amplifier, a filter and a comparator. The amplifier amplifies a signal difference between the first and second output signals and outputs a train of pulses if a peak of the input signal exceeds the reference input signal. A second reference signal is applied to the comparator which generates an output which indicates whether the input signal exceeds a pre-determined threshold value. The signal amplitude comparator also includes a pair of input amplifiers which receive and translate the input and reference input signals to levels suitable for the input circuits.

14 Claims, 4 Drawing Sheets

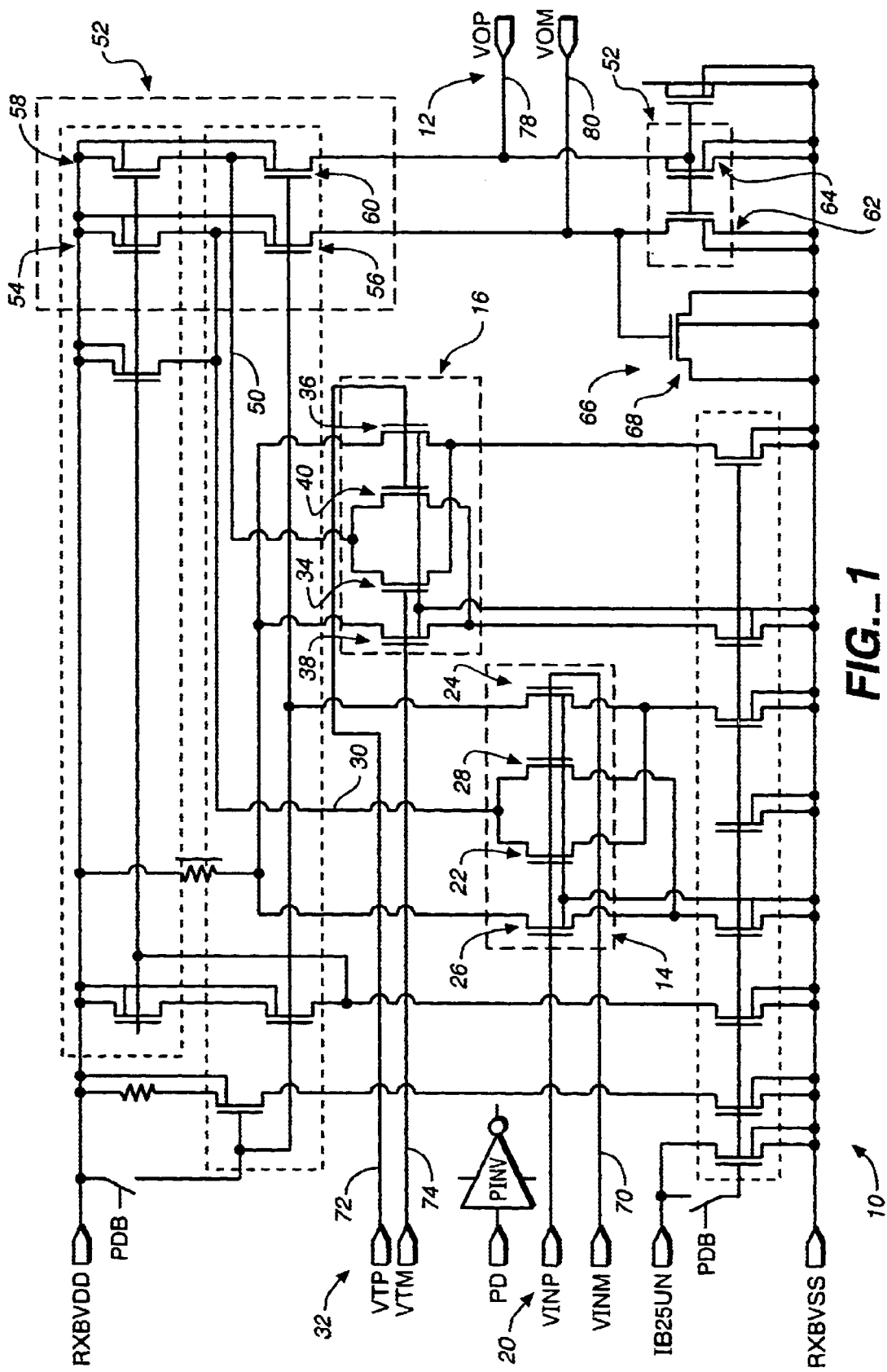
FIG._1

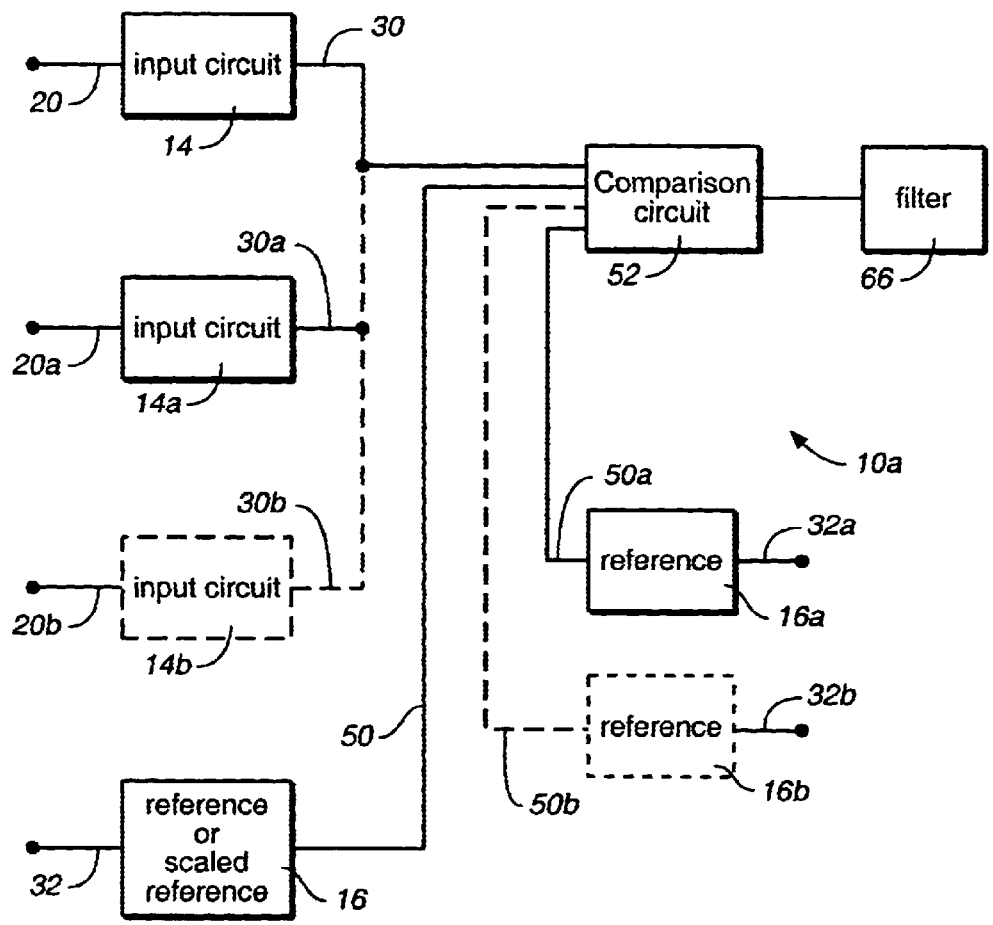
FIG._2
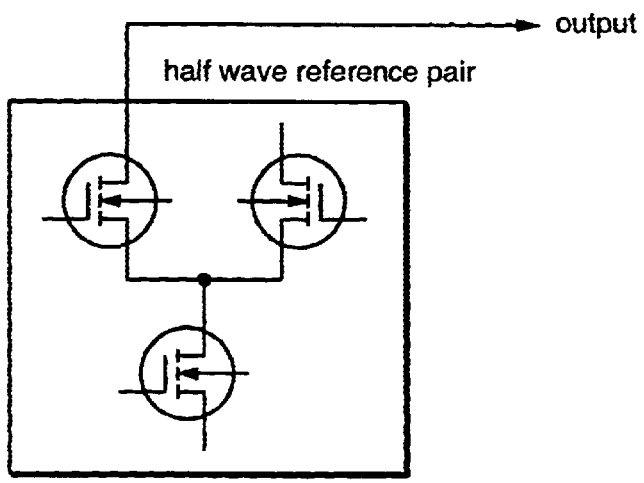
FIG._3

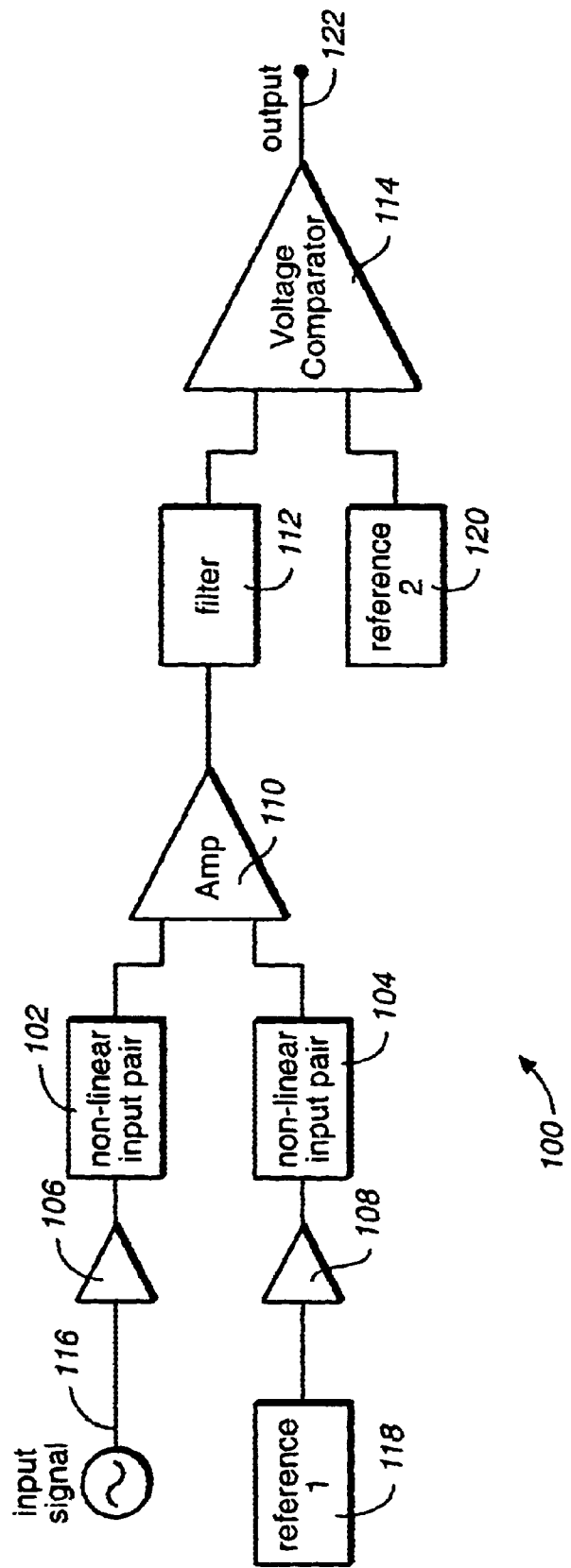
FIG._4

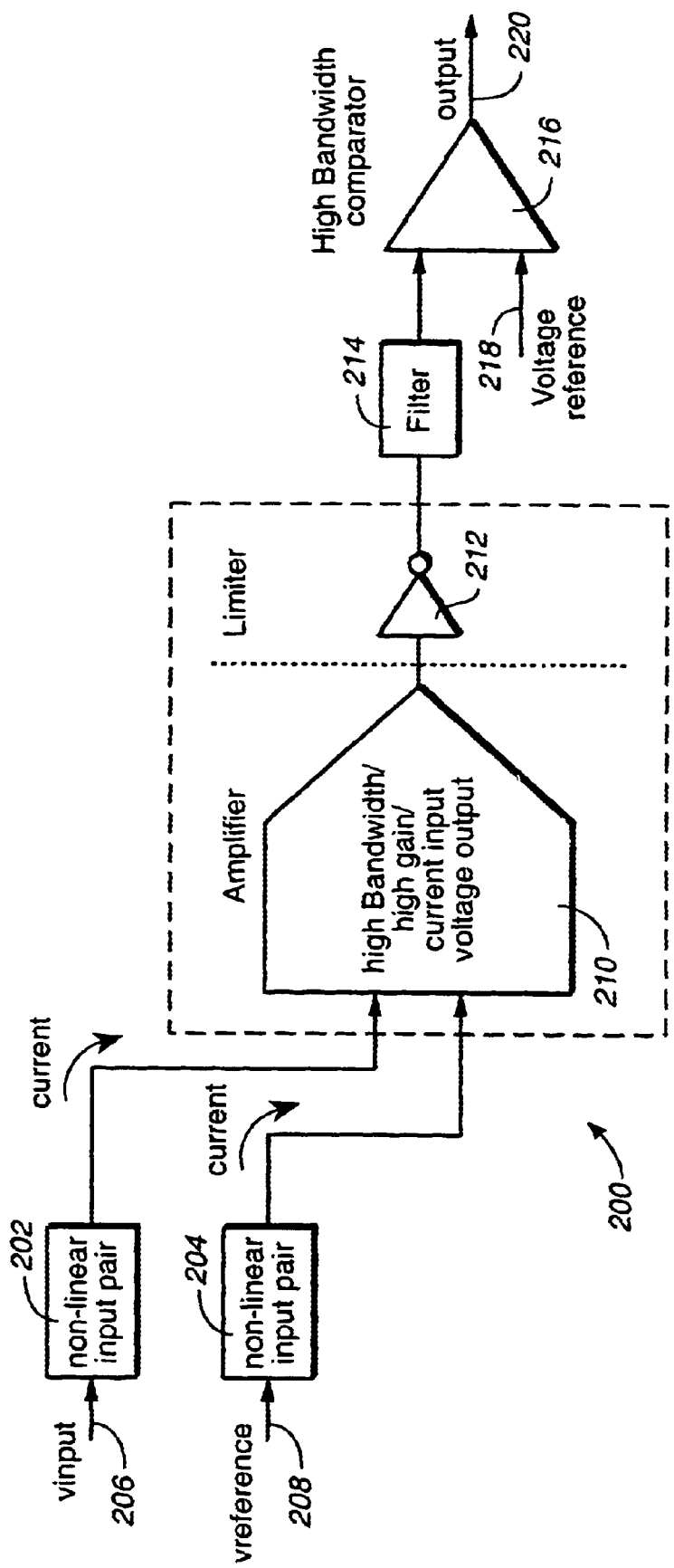
FIG._5

SIGNAL AMPLITUDE COMPARATOR

RELATED APPLICATION (PRIORITY CLAIM)

The present application is a continuation-in-part of U.S. patent application Ser. No. 10/156,963, filed May 29, 2002 now U.S. Pat. No. 6,617,889.

BACKGROUND

The present invention generally relates to methods and devices for detecting the presence or absence of high frequency signals in a system, and more specifically relates to a signal amplitude comparator.

The invention also relates to the use of a second threshold to make a circuit more sensitive to the peak amplitude of a signal applied to the circuit, and also relates to performing comparisons using devices operating large signal power law mode, thereby providing a better signal level than operation in linear mode for a given power level at a given offset.

There are numerous methods to detect the presence or absence of high frequency signals in a system. When the signal is primarily of alternating current, at frequencies where it is somewhat difficult to generate gain in a given semiconductor process, at a signal swing that is small compared to the Vt of the device and power is limited, the task becomes more difficult.

Dual differencing amplifiers have been applied to signal processing and comparison tasks with good success. However, at high frequencies, it is difficult to get good performance.

Square law operation of MOS transistors can generate good signal levels at high frequencies for signal detection. The presence of the direct current term as a result of product detection has an average value that can be constant over a wide range of frequencies. However, typical process variation makes it difficult to get a repeatable threshold value.

Signal amplitude comparator circuits can fall into two broad classes: average amplitude or RMS detectors and peak or near peak detectors. One aspect of the present invention uses a comparison circuit based on that which is disclosed in U.S. patent application Ser. No. 10/156,963, filed May 29, 2002, which is hereby incorporated herein by reference in its entirety, and the use of a second fixed threshold to make the circuit more sensitive to the peak amplitude of the signal applied. An additional facet of the circuit is that the comparisons are performed with devices operating large signal power law mode. This provides a better signal level than operation in linear mode for a given power level at a given offset. For Field Effect Transistors (FET's), the operation in the comparison circuit is largely square-law.

OBJECTS AND SUMMARY

A general object of an embodiment of the present invention is to provide a signal amplitude comparator which is configured to generate an output that accurately determines presence of a signal with a repeatable amount of amplitude.

Another object of an embodiment of the present invention is to provide a differential input circuit that is configured to generate an output current that is a non-linear function of an input voltage, and is configured to produce even order harmonic distortion over an input voltage range of interest.

Still another object of an embodiment of the present invention is to provide a signal amplitude comparator which uses a second fixed threshold to make the circuit more sensitive to the peak amplitude of the signal applied.

Yet another object of an embodiment of the present invention is to provide a signal amplitude comparator which provides that comparisons are performed with devices operating large signal power law mode.

Briefly, and in accordance with at least one of the forgoing objects, an embodiment of the present invention provides a signal amplitude comparator which includes a first differential input circuit that is biased, is configured to receive an input signal and is configured to generate a first output signal that is a non-linear function of the input signal, a second differential input circuit which is biased similarly to the first differential input circuit, is configured to receive a reference input signal and is configured to generate a second output signal that generally tracks process, temperature and supply variation, an amplifier which is connected to the first and second differential input circuits, a filter which is connected to the amplifier and a comparator which is connected to the filter. The amplifier is configured to amplify a signal difference between the first and second output signals and is configured to output a train of pulses to the filter if a peak of the input signal exceeds the reference input signal. A second reference signal is applied to the comparator, and the comparator is configured to receive and compare the first and second output signals, and is configured to generate an output which indicates whether the input signal exceeds a pre-determined threshold value. The signal amplitude comparator also includes a pair of linear (over the detection range of interest) input amplifiers which are connected to the first and second differential input circuits and are configured to receive and translate the input and reference input signals to levels suitable for the first and second differential input circuits.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 is a schematic drawing of a signal amplitude comparator which is in accordance with an embodiment of the present invention;

FIG. 2 is a block diagram of a full-wave poly-phase signal amplitude comparator which is accordance with an embodiment of the present invention;

FIG. 3 is a block diagram of a poly-phase signal amplitude comparator which is accordance with an embodiment of the present invention; and FIG. 4 is a block diagram of a modified signal amplitude comparator which is in accordance with an embodiment of the present invention.

FIG. 5 is a block diagram of a modified signal amplitude which is in accordance with an embodiment of the present invention.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

FIG. 1 illustrates a signal amplitude comparator 10 which is in accordance with an embodiment of the present invention. Many aspects of what is shown in FIG. 1 would be readily understood by one having ordinary skill in the art while reviewing FIG. 1. Those aspects of FIG. 1 which directly relate to the present invention are described hereinbelow. The signal amplitude comparator 10 is configured to generate an output 12 that accurately determines presence of a signal with a repeatable amount of amplitude.

The signal amplitude comparator 10 includes a first differential input circuit 14 and a second differential input circuit 16 which is effectively a replica of the first differential input circuit 14. Each differential input circuit consists of a pair of input circuits. Specifically, the first differential input circuit 14 is configured to receive an input voltage 20, and consists of two asymmetrical differential transistor pairs, a first pair which consists of transistor 22 and 24, wherein transistor 24 is biased so that it is in saturation for all signal levels where an accurate comparison is required. Transistors 26 and 28 form an opposing, second coupled transistor pair which is biased in an identical matter. The drains of transistors 22 and 28 are connected together and form the output 30 of the first differential input circuit 14. All input and reference devices are built from multiple legs of width W/L; best practices for device matching should be followed.

The first differential input circuit 14 is configured to generate an output current that is a non-linear function of the input voltage. The width ratio of 24 to 22 set by the ratio of the number of legs, determines the non-linearity of the transfer function; if 24 is much, much wider than 22, the transfer function will approach the natural transfer function of the device, which in the case of a FET, will be square-law. For smaller width ratios, a more linear transfer function is given. It is expected that, for most cases, a ratio of 8:1 will work well. While higher ratios will generally provide better performance, higher ratios also generally require greater power levels. Smaller ratios tend to be more linear, and this reduces the output signal level.

The second differential input circuit 16 is configured to receive a reference input voltage 32 which may be a direct current voltage source or an alternating current voltage source. Like the first differential input circuit 14, the second differential input circuit 16 consists of two asymmetrical differential transistor pairs. A first pair consists of transistors 34 and 36, wherein transistor 36 is biased so that it is in saturation for all signal levels expected. Transistors 38 and 40 form an opposing, second coupled transistor pair which is biased in an identical matter. The drains of transistors 34 and 40 are connected together and form the output 50 of the second differential input circuit 16. The output 50 is a current that generally tracks process, temperature and supply variation.

In addition to the first differential input circuit 14 and second differential input circuit 16, the signal amplitude comparator 10 includes a comparator or comparison circuit 52 which is connected to the first differential input circuit 14 and second differential input circuit 16. The comparator 52 is configured to receive the outputs 30, 50 from the first differential input circuit 14 and second differential input circuit 16 and compare the signals to determine whether the input voltage 20 exceeds a pre-determined threshold value. As shown, the comparator 52 may consist of a plurality of transistors 54, 56, 58, 60, 62 and 64. The signal amplitude comparator 10 also preferably includes a filter or filtering circuit 66 which consists of a transistor 68.

The signal amplitude comparator 10 can be configured such that the first differential input circuit 14 generates an output current 30 that is a non-linear function of the input voltage 20 and produces even order harmonic distortion over the input voltage range of interest.

Input capacitance is primarily related to the size of transistors 22 and 28. The other transistors in the differential input circuit 14, i.e., transistors 24 and 26, act primarily as source followers and do not contribute, relative to their size, to the input capacitance. Offset performance is a function of the size of the smaller device as well. Each process has a different sensitivity to offsets, so the devices must be scaled accordingly.

When the average current through transistor 22 and 28, summed, exceeds the current 50 from the reference pair, the difference in the voltage at the output 12, VOP (78 in FIG. 1)–VOM (80 in FIG. 1), will become positive indicating that the signal has exceeded the threshold. The signal amplitude comparator 10 can use an alternating current voltage as well as a direct current voltage for a reference 32. If the reference and measured signal voltages have similar waveshapes, the accuracy with respect to the reference signal will be very good. If, as in the case for the actual application, the waveforms do not match, it can only be determined that the input has met the threshold based on the waveshape which are expected.

As shown in FIG. 1, transistor 22 is connected common-source to transistor 24. In operation, the common source connection tends to track the VINM input (70) but offset by a Vt. Since transistor 22 is much smaller than transistor 24, the current in transistor 22 can vary considerably without upsetting the operation of transistor 24. As a result, transistor 22 operates primarily as a square law device generating an output current that varies with VINP (72) minus VINM (74) squared up to the point where transistor 22 gets cut-off. This does not generally affect the circuit operation. Since the signal shape of the crest-factor is known, a suitable threshold voltage (such as a direct current voltage) may be selected. It is preferable that oppositely connected signal path input differential pairs be used, so at the time one side gets cut-off, the other side is generating a strong squared signal.

The reference differential pair 16 is configured to generate an output current that tracks the process, temperature and supply variation. So, for example, if k-prime drops due to a higher on-chip temperature, the output 50 from the reference 16 drops also moving the actual reference back to the same relative place it was.

The two currents 30 and 50 are compared in the output stage and filtered by filter 66. When the input signal pair 14 generates a current 30 that exceeds the reference current, the output voltage difference VOP (78) minus VOM (80) goes positive indicating that the signal has crossed the threshold.

FIG. 2 illustrates a poly-phase signal amplitude comparator 10a which is similar to that which is shown in FIG. 1, and is in accordance with an embodiment of the present invention. As shown in FIG. 2, the poly-phase signal amplitude comparator 10a includes an input circuit 14, a reference circuit or scaled reference circuit 16, a comparison cicuit 52 and a filter 66 much like the signal amplitude comparator 10 shown in FIG. 1. However, as shown in FIG. 2, the poly-phase signal amplitude comparator 10a includes an additional input circuit 14a (or two additional input circuits 14a and 14b (shown in phantom) if a three-phase detector is desired) and an additional reference circuit 16a. Additional input circuits and reference circuits or reference scaling can be added for higher order poly-phase operation.

As shown in FIG. 2, input circuit 14a receives input 20a and outputs output 30a (and input circuit 14b, if provided, receives input 20b and outputs output 30b). Preferably, input circuits 14, 14a (and 14b if provided) are "full wave". However, both the input circuits and the reference circuit can be provided as being "half wave", and may be provided as shown in FIG. 3.

In FIG. 2, the second differential input circuit 14a receives input 20a and produces a second output 30a that is summed with output 30 (and with output 30b, if input circuit 14b is provided). The composite output 30+30a (or 30+30a+30b, if input circuit 14b is provided) is compared with the reference current 50 in the comparator 52 and is filtered by filter 66. In the event that the inputs 20 and 20a (and 20b if input circuit 14b is provided) are sinusoidal and have a relationship in phase such that 20 and 20a (and 20b, if reference circuit 14b is provided) are 90 degrees apart, the identity sin squared plus cosine squared equals one can be applied. In this case, the reference will now represent the peak of the poly-phase source 20,20a (or 20, 20a and 20b, if input circuit 14b is provided) without scaling. This configuration or the logical extension of it represents a poly-phase signal amplitude comparator. The second reference circuit 16a provides reference output 50a from input 32a. In such case, the reference 50+50a and signal 30+30a will be compared in a single comparison circuit 52 and will be filtered by 66. By logical extension, the third input circuit 14b and reference 16b (both of which are shown in phantom in FIG. 2) can be added, and a three-phase detector is the result. If the reference is a direct current voltage, the multiple reference circuits can be combined in the poly-phase case to give a single appropriately scaled reference circuit.

FIG. 4 illustrates a modified signal amplitude comparator 100 which is generally based on the signal amplitude comparator 10 and 10a illustrated in FIGS. 1 and 2, respectively. The modified signal amplitude comparator 100 includes two non-linear input pairs 102 and 104 much like the first and second differential input circuits 14 and 16 shown in FIGS. 1 and 2 and described in detail hereinabove. The modified signal amplitude comparator 100 also includes a pair of amplifiers 106 and 108, preferably with matching gain, a saturating, high gain, high speed current amplifier 110, a filter 112, and a voltage comparator 114. Amplifier 106 is configured to receive an input signal 116, and amplifier 108 is configured to receive a reference signal 118. Additionally, a second reference signal 120 is applied to the voltage comparator 114 which is configured to produce an output 122 which indicates whether the input signal 116 exceeds a pre-determined threshold value.

The pair of linear (over the detection range of interest) input amplifiers 106 and 108 are configured to translate the input signal 116 and reference signal 118 to levels suitable for the set of asymmetrical input circuits 102 and 104, respectively. The outputs of the two input circuits 102 and 104 are amplified by the saturating, high gain, high speed current amplifier 110. The output of the amplifier 110, which effectively amplifies the difference between the input signal 116 and reference signal 118, is configured to provide a train of pulses that are present when the peak of the input signal 116 exceeds the reference signal 118. The filter 112 is provided at the output of the amplifier 110, and the output of the filter 112 is applied to the voltage comparator 114 with the second reference signal 120, which may be a fixed non-zero reference. The reference signals 118 and 120 may both be fixed. Alternatively, both may be adjustable to provide variable primary and secondary responses.

When a signal is applied to the input 116 that exceeds the first, input reference signal 118 provided, a pulse appears at the output of the current amplifier 110. When the filtered output of this stage exceeds the second reference signal 120, the output comparator 114 switches, indicating the presence of a signal 116 with a peak level above the first reference input signal 118. Since the signal at the output of the amplifier 110 disappears when input signal 116 is less than reference signal 118, any signal present can largely indicate that the signal 116 has a peak above the reference signal 118 which will likely be a DC level. A second level of comparison is added (via comparator 114) at the output of the filtered pulse train to provide noise immunity and some level of adjustment to the peak sensitivity. This does also represent an error in the peak signal level detected so the noise immunity and the peak accuracy need to be traded off. The difference being that the first reference signal 118 sets the gross peak level of interest and the second reference signal 120 sets what percentage of time the input signal 116 must be above the reference signal 118 to provide an output 122.

The modified signal amplitude comparator 100 shown in FIG. 4 uses a second fixed threshold signal 120 which makes the circuit more sensitive to the peak amplitude of the signal 116 applied. Additionally, the modified signal amplitude comparator 100 provides that comparisons are performed with devices operating large signal power law mode. This provides a better signal level than operation in linear mode for a given power level at a given offset.

FIG. 5 is a block diagram which is similar to FIG. 4. FIG. 5 illustrates a modified signal amplitude comparator 200 which includes a first non-linear input pair 202 and a second non-linear input pair 204 where the first non-linear input pair 202 receives an input signal 206 ("vinput") and the second non-linear input pair 204 receives a reference voltage 208 ("vreference"). The current output from the two non-linear input pairs 202, 204 are placed through an amplifier stage (via amplifier 210) which generates an output voltage from the difference between the two input currents. The output voltage is then sent into an inverter 212 that limits voltage amplitude. Thus, the limiter 212 outputs a train of pulses. The resulting train of pulses from the limiter 212 is sent into a filter 214 which integrates the pulse into a voltage level. The output of the filter 214 is provided to a high bandwidth/high gain comparator 216 which compares the output to a reference voltage 218, where reference voltage 218 is separate from reference voltage 208 ("voltage reference"), i.e., reference voltage 208 and reference voltage 218 can be set arbitrarily from each other. The output 220 of the comparator 216 is high if the input signal 206 is greater than reference voltage 208 and low if less than reference voltage 208.

While embodiments of the present invention are shown and described, it is envisioned that those skilled in the art may devise various modifications of the present invention without departing from the spirit and scope of the appended claims.

What is claimed is:

1. A signal amplitude comparator configured to receive an input signal, a first reference input signal and a second reference input signal and is configured to generate an output which indicates whether the input signal exceeds a pre-determined threshold value, said signal amplitude comparator comprising a first differential input circuit that is biased, is configured to receive the input signal, and is configured to generate a first output that is a non-linear function of the input signal, a second differential input circuit which is biased similarly to the first differential input circuit, is configured to receive said first reference input signal, and is configured to generate a second output that generally tracks process, temperature and supply variation, a pair of linear input amplifiers which are connected to the first and second differential input circuits and are configured to receive and translate the input signal and the first reference input signal to levels suitable for the first and second differential input circuits, an amplifier which is connected to the first and second differential input circuits, a filter which is connected to the amplifier, and a comparator which is connected to the filter, said comparator configured to receive an output from the filter and the second reference input signal, said amplifier configured to amplify a signal difference between the first and second outputs and configured to output a train of pulses to the filter if a peak of the input signal exceeds the first reference input signal, said comparator configured to compare the first and second outputs and generate the output which indicates whether said input signal exceeds the pre-determined threshold value.

2. A signal amplitude comparator as claimed in claim 1, wherein said first differential input circuit is configured to produce even order harmonic distortion over a pre-determined range of the input signal.

3. A signal amplitude comparator as claimed in claim 1, wherein said first differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signal levels.

4. A signal amplitude comparator as claimed in claim 3, wherein a ratio of said third transistor to said first transistor determines the non-linearity of the transfer function.

5. A signal amplitude comparator as claimed in claim 4, wherein the ratio of said third transistor to said first transistor is eight to one.

6. A signal amplitude comparator as claimed in claim 3, wherein said second transistor and said fourth transistor form a coupled pair with the fourth transistor being biased so that said fourth transistor is in saturation for a range of signal levels.

7. A signal amplitude comparator as claimed in claim 6, wherein said first transistor includes a drain and said second transistor includes a drain, said drain of said first transistor being connected to said drain of said second transistor thereby providing said first output.

8. A signal amplitude comparator as claimed in claim 1, wherein said second differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signal levels.

9. A signal amplitude comparator as claimed in claim 8, wherein said second transistor and said fourth transistor form a coupled pair with the fourth transistor being biased so that said fourth transistor is in saturation for a range of signal levels.

10. A signal amplitude comparator as claimed in claim 9, wherein said first transistor includes a drain and said second transistor includes a drain, said drain of said first transistor being connected to said drain of said second transistor thereby providing said second output.

11. A signal amplitude comparator as claimed in claim 1, wherein said first differential input circuit comprises a pair of input circuits, said pair of input circuits comprising a first transistor, a second transistor, a third transistor and a fourth transistor, said first and said third transistors forming an asymmetrical differential pair with the third transistor being biased so that said third transistor is in saturation for a range of signal levels, wherein said second differential input circuit comprises a pair of input circuits, said pair of input circuits comprising a fifth transistor, a sixth transistor, a seventh transistor and an eighth transistor, said fifth and said seventh transistors forming an asymmetrical differential pair with the seventh transistor being biased so that said seventh transistor is in saturation for a range of signal levels.

12. A signal amplitude comparator as claimed in claim 11, wherein said second transistor and said fourth transistor form a coupled pair with the fourth transistor being biased so that said fourth transistor is in saturation for a range of signal levels, wherein said sixth transistor and said eighth transistor form a coupled pair with the eighth transistor being biased so that said eighth transistor is in saturation for a range of signal levels.

13. A signal amplitude comparator as claimed in claim 12, wherein said first transistor includes a drain and said second transistor includes a drain, said drain of said first transistor being connected to said drain of said second transistor thereby providing said first output current, wherein said fifth transistor includes a drain and said sixth transistor includes a drain, said drain of said fifth transistor being connected to said drain of said sixth transistor thereby providing said second output.

14. A signal amplitude comparator as claimed in claim 1, wherein both the first and second reference input signals are adjustable, thereby providing that primary and secondary responses are variable.

\* \* \* \* \*